United States Patent [19]
Yoshikawa

[11] Patent Number: 5,378,910
[45] Date of Patent: Jan. 3, 1995

[54] MEMORY TRANSISTOR HAVING INCREASED INTERELECTRODE CAPACITANCE

[75] Inventor: Kuniyoshi Yoshikawa, Tokyo, Japan

[73] Assignee: Kabushiki Kaisha Toshiba, Kawasaki, Japan

[21] Appl. No.: 86,035

[22] Filed: Jul. 6, 1993

[30] Foreign Application Priority Data

Jul. 8, 1992 [JP] Japan .................. 4-180922

[51] Int. Cl.⁶ .................. H01L 29/68; H01L 29/78
[52] U.S. Cl. .................. 257/319; 257/332; 257/532; 257/314
[58] Field of Search ............. 257/314, 315, 316, 532, 257/330, 332, 319

[56] References Cited

U.S. PATENT DOCUMENTS 4,618,876 10/1986 Stewart et al. .................. 257/315

FOREIGN PATENT DOCUMENTS 57-59388 4/1982 Japan .................. 257/315

Primary Examiner—Jerome Jackson
Assistant Examiner—Donald L. Monin, Jr.
Attorney, Agent, or Firm—Banner, Birch, McKie & Beckett

[57] ABSTRACT

A semiconductor memory device employing an element separating film, a conductive film, and an insulating film structure formed on a semiconductor substrate in this order. First side wall members are provided on the side surfaces of the element separating film, of the conductive film, and of the insulating film structure. A first gate electrode is formed on the insulating film structure, on the first side wall members, and on a first gate insulating film structure provided on the semiconductor substrate, adjacent to the first side wall members. A second gate insulating film structure is formed on the first gate electrode. Second side wall members are formed on the side surfaces of the second gate insulating film structure and of the first gate electrode. Contact holes are formed in the insulating film structure in a self-alignment manner by virtue of the second side wall members. A second gate electrode is formed on the inner peripheral surfaces of the contact holes, on the second side wall members, and on the second gate insulating film structure, such that the second gate electrode is connected to the conductive film through the contact holes.

8 Claims, 4 Drawing Sheets

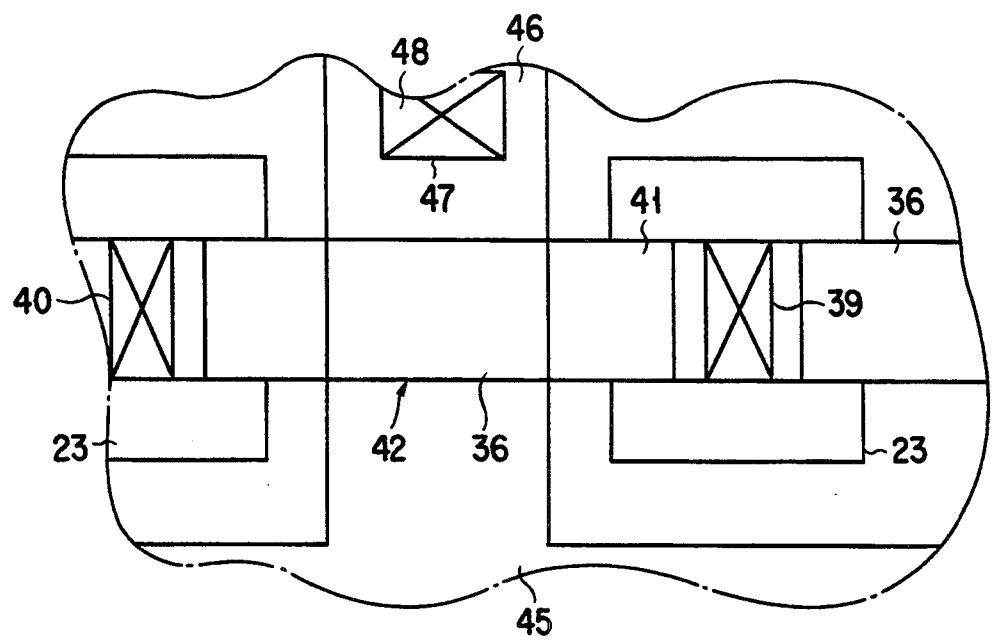
F I G. 9
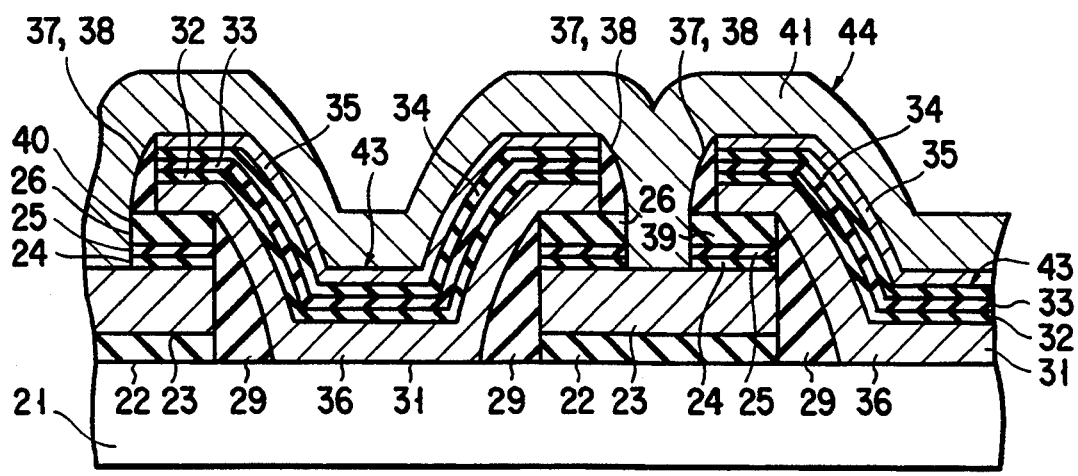
F I G. 10

MEMORY TRANSISTOR HAVING INCREASED INTERELECTRODE CAPACITANCE

BACKGROUND OF THE INVENTION

1. Field of the Invention

This invention relates to an improvement of a semiconductor memory device, such as a non-volatile memory cell or a DRAM cell, which has a large capacitance between gate electrodes and a low writing voltage.

2. Description of the Related Art

A conventional non-volatile semiconductor memory device such as a PROM has a memory cell structure as shown in FIGS. 1 and 2. As is shown in FIG. 1, a p-type semiconductor substrate 1 has a field oxide film 3 formed thereon to serve as an element-separating region for separating an element region 2. FIG. 2 shows the cross section of a two-layered gate electrode portion of the memory cell structure taken along the channel length direction thereof. As is shown in FIG. 2, the element region 2 has n+-type source and drain regions 4 and 5 which are electrically separated from each other, and a channel region 11 extending therebetween. A first gate electrode 7 serving as a floating gate electrode and made, for example, of polycrystal silicon doped with an impurity is formed on the element region 2, with a first gate insulating film 6 interposed therebetween. A second gate electrode 9 serving as a control gate electrode made, for example, of polycrystal silicon doped with an impurity is stacked on the first gate electrode 7, with a second gate insulating film 8 interposed therebetween. Opposite ends of the first gate electrode 7 extend in the channel width direction and partially overlap with the field oxide film 3, as is shown in FIG. 1. An insulating film 10 is formed on the exposed side surfaces of the first gate electrode 7 and on the second gate electrode 9, as is shown in FIG. 2. In the case of this PROM, a high voltage is applied to the n+-type drain region 5 to thereby inject and accumulate hot electrons generated in the channel region 11, into the first gate electrode 7 through the first gate insulating film 6, so as to vary the threshold voltage Vth of the cell and thus enable the cell to maintain its memory function.

FIG. 3 shows an electrical circuit employed in the PROM shown in FIGS. 1 and 2 and used at the time of writing. The voltage $V_{FG}$ of the floating gate electrode 7 and the voltage $V_{CG}$ of the control gate electrode 9 have the following relationship:

$$V_{FG} = C_2 \cdot V_{CG}/C_T + C_3 \cdot V_D/C_T \quad (1)$$

$$C_T = C_1 + C_2 + C_3 \quad (2)$$

where $C_1$ represents a capacitance between the substrate 1 and the floating gate electrode 7, $C_2$ a capacitance between the floating gate electrode 7 and the control gate electrode 9, $C_3$ the capacitance of an overlapping portion between the drain region 5 and the floating gate electrode 7, and $V_D$ a drain voltage.

The so-called writing voltage of the PROM is determined on the basis of the voltage VFG of the floating gate electrode 7, the voltage VFG actually being controlled by the voltage $V_{CG}$ of the control gate electrode 9. As a result, the proportional coefficient between $V_{FG}$ and $V_{CG}$ is $C_2/C_T$, and writing can be performed at low voltage only if the capacitance $C_2$ between the floating gate electrode 7 and the control gate electrode 9 is large.

In the prior art, the writing voltage applied to the control gate electrode of a 1-Mbit EPROM device is as high as 12.5 V. A reduction in writing voltage will be required in accordance with further scaling-down of semiconductor elements in near future. Reducing the thickness of the second gate insulating film 8 shown in FIG. 1 is one possible method for increasing the capacitance $C_2$ between the gate electrodes. In practice, however, it is difficult to accomplish this without degrading required characteristics of the film.

SUMMARY OF THE INVENTION

The present invention has been developed in light of the above circumstances, and its object is to provide a semiconductor memory device having a large capacitance between gate electrodes, but without degrading the characteristics of a memory cell, and which hence has a low writing voltage, and also to provide a method for manufacturing the device.

According to a first aspect of the invention, there is provided a semiconductor memory device comprising:
  a semiconductor substrate;
  an element separating film formed on the semiconductor substrate;
  a conductive film formed on the element separating film;
  an insulating film structure formed on the conductive film;
  first side wall members formed on the side surfaces of the element separating film, of the conductive film, and of the insulating film structure;
  a first gate insulating film structure formed on the semiconductor substrate, adjacent to the first side wall members;
  a first gate electrode formed on the insulating film structure, on the first side wall members, and on the first gate insulating film structure;
  a second gate insulating film structure formed on the first gate electrode;
  second side wall members formed on the side surfaces of the second gate insulating film structure and of the first gate electrode;
  contact holes formed in the insulating film structure in a self alignment manner by virtue of the second side wall members; and
  a second gate electrode formed on the inner peripheral surfaces of the contact holes, on the second side wall members, and on the second gate insulating film structure, the second gate electrode being connected to the conductive film.

According to a second aspect of the invention, there is provided a semiconductor memory device comprising:
  a semiconductor substrate;
  a first insulating film structure formed on the semiconductor substrate;
  a first conductive layer formed on the first insulating film structure;
  a second insulating film structure formed on the first conductive layer;
  first side wall members formed on the side surfaces of the first and second insulating film structures, and of the first conductive layer;
  a second conductive layer formed on the semiconductor substrate, and having an end formed on the first side wall members and on the second insulating film structure;

a third insulating film structure formed on the second conductive layer;

second side wall members formed on the side surfaces of the second conductive layer and of the third insulating film structure;

contact holes formed in the second insulating film structure in a self alignment manner by virtue of the second side wall members; and a third conductive layer formed on the inner peripheral surfaces of the contact holes, on the second side wall members, and on the third insulating film structure, the third conductive layer being connected to the first conductive layer.

In the semiconductor memory device of the invention constructed as above, for example, in either a PROM cell as a non-volatile memory cell or a DRAM cell, the capacitance between gate electrodes can be increased without degradation of the characteristics of the cell, and hence the writing voltage can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 9 is a pattern plan view of the cross section shown in FIG. 7; and

FIG. 10 is a cross sectional view, showing a manufacturing step of a DRAM memory cell according to another embodiment of the invention.

DETAILED DESCRIPTION OF THE PREFERRED EMBODIMENTS

The embodiments of the invention will be explained with reference to the accompanying drawings.

Figure 4:
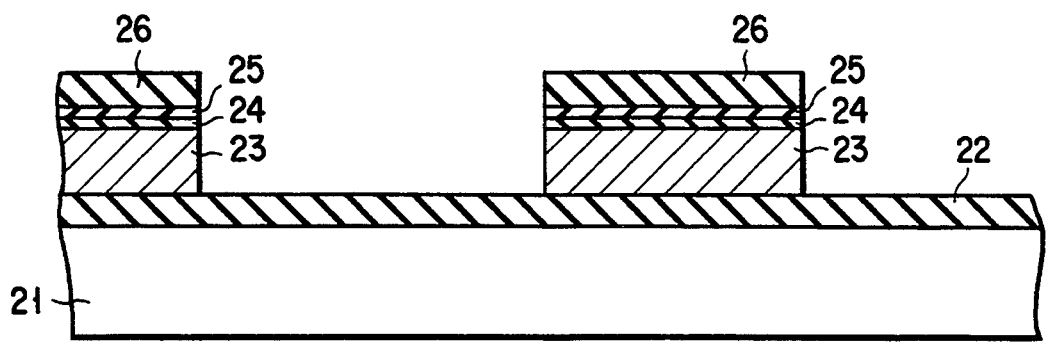
FIG. 4 is a sectional view, showing a manufacturing step of a non-volatile memory cell according to an embodiment of the invention.

FIGS. 4–9 are cross sectional views, showing a method for manufacturing a memory cell employed in a semiconductor device such as a PROM, a non-volatile semiconductor memory device. First, as is shown in FIG. 4, a first oxide film 22 having a thickness of about 1000 Å is formed on a p-type silicon substrate 21, and a first polycrystal silicon film 23 having a thickness of about 2000 Å doped with P is formed on the first oxide film 22. A second oxide film 24 having a thickness of about 100 Å is formed on the polycrystal silicon film 23, and a first silicon nitride film 25 having a thickness of about 150 Å is deposited on the second oxide film 24. A third oxide film 26 having a thickness of about 1000 Å is deposited on the first silicon nitride film 25. Thereafter, the third oxide film 26, first silicon nitride film 25, second oxide film 24, and first polycrystal silicon film 23 are patterned by anisotropic etching.

Figure 5:
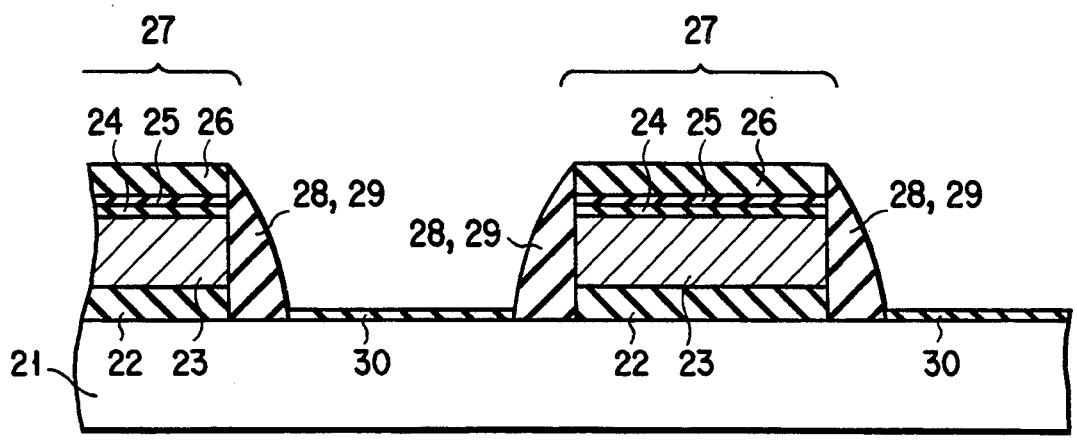
FIG. 5 shows another manufacturing step of the non-volatile memory cell of the invention, in which an element separating region is formed.

Then, as is shown in FIG. 5, the first oxide film 22 is patterned to form an element separating region 27. Successively, a fourth oxide film 28 having a thickness of about 2000 Å is deposited by the CVD method on the p-type silicon substrate 21 and third oxide film 26. The fourth oxide film 28 is etched by anistropic etching to form first side wall members 29 on the side surfaces of the first polycrystal silicon film 23. A first gate insulating film 30 having a thickness of about 100 Å is formed on the p-type silicon substrate 21 by thermal oxidation.

Figure 6:
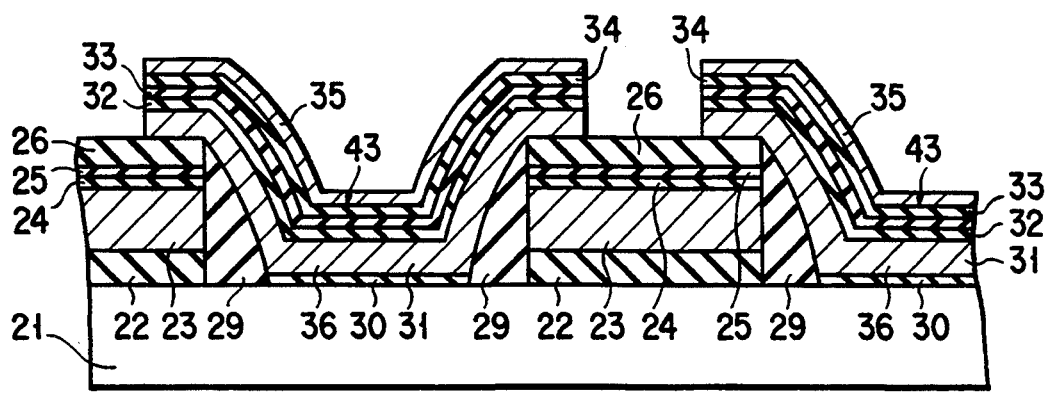
FIG. 6 shows a manufacturing step performed successive to the step shown in FIG. 5, in which a first gate electrode as a floating gate electrode is formed.

Thereafter, as is shown in FIG. 6, a second polycrystal silicon film 31 having a thickness of about 1000 Å and doped with P is deposited on the first gate insulating film 30, first side wall members 29, and third oxide film 26. A fifth oxide film 32 having a thickness of about 100 Å is formed on the second polycrystal silicon film 31 by e.g. thermal oxidation, and a second silicon nitride film 33 having a thickness of about 150 Å is deposited on the fifth oxide film 32. A sixth oxide film 34 having a thickness of about 50 Å is formed on the second silicon nitride film 33, and a third polycrystal silicon film 35 having a thickness of about 500 Å is formed on the sixth oxide film 34. Thereafter, the third polycrystal silicon film 35, sixth oxide film 34, second silicon nitride film 33, fifth oxide film 32, and second polycrystal silicon film 31 are patterned by photoetching, thereby forming a first gate electrode 36 consisting of the second polycrystal silicon film 31 and serving as a floating gate electrode, and a second gate insulating film 43 consisting of the fifth and sixth oxide films 32 and 34 and second silicon nitride film 33.

Figure 7:
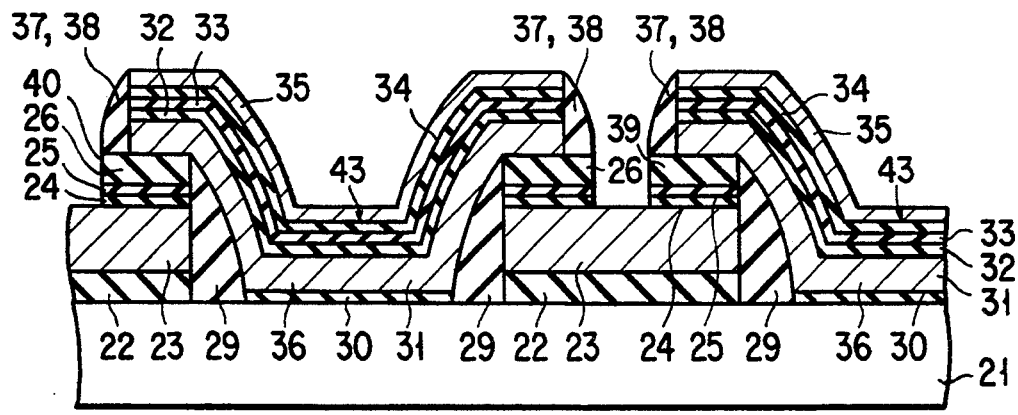
FIG. 7 shows a manufacturing step performed successive to the step shown in FIG. 6, in which a contact hole is formed.

Subsequently, as is shown in FIG. 7, a seventh oxide film 37 having a thickness of about 2000 Å is deposited by the CVD method on the third polycrystal silicon film 35 and third oxide film 26. Then, the seventh oxide film 37 is etched by anisotropic etching to form second side wall members 38 on the side surfaces of the first gate electrode 36. At the same time, the third oxide film 26, first silicon nitride film 25, and second oxide film 24 are etched in a self-alignment manner by virtue of the second side wall members 38 to thereby form first and second contact holes 39 and 40.

Figure 8:
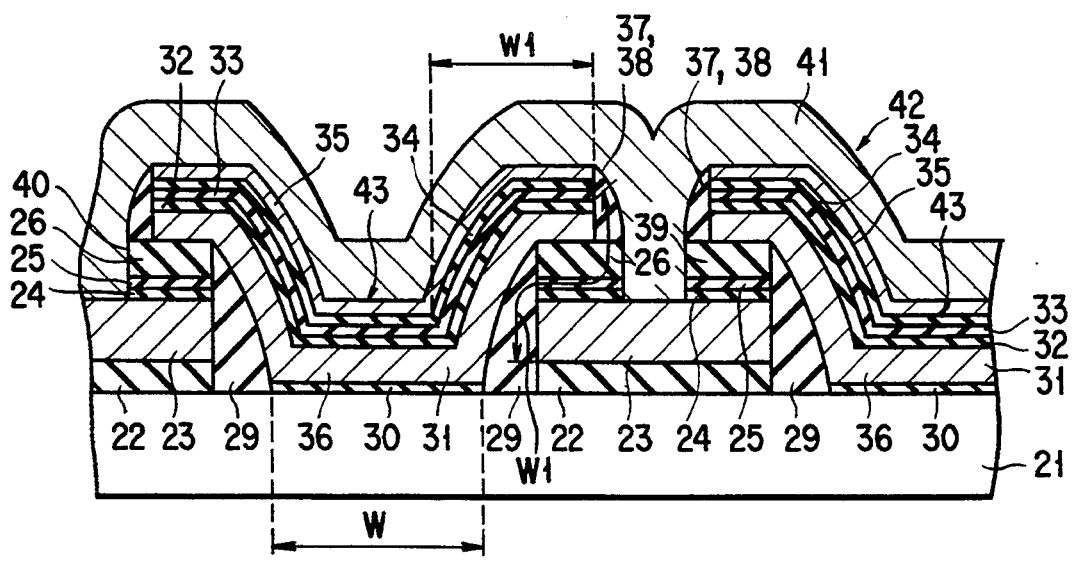
FIG. 8 shows a manufacturing step performed successive to the step shown in FIG. 7, in which a second gate electrode as a control gate electrode is formed.

Thereafter, as is shown in FIG. 8, a fourth polycrystal silicon film 41 having a thickness of about 2000 Å is deposited on the inner surfaces of the first and second contact holes 39 and 40 and on the third polycrystal silicon film 35 and second side wall members 38, thus electrically connecting the fourth polycrystal silicon film 41 to the first polycrystal silicon film 23. Then, the fourth polycrystal silicon film 41 is patterned by photo-etching to thereby form a second gate electrode 42 consisting of the first, third, and fourth polycrystal silicon films 23, 35, and 41 and serving as a control gate electrode. Thereafter, arsenic ions, which are n-type impurity ions, are injected and diffused, using the second gate electrode 42 and first side wall members 29 as masks. Thus, source and drain diffusion layers (not shown) are formed in the p-type silicon substrate 21.

FIG. 9 is a pattern plan view of the semiconductor device of FIG. 8. The second gate electrode 42 consists of the first and fourth polycrystal silicon films 23 and 41, which are electrically connected to each other through the first and second contact holes 39 and 40. The first gate electrode 36 has its opposite ends wrapped with the silicon films 23 and 41, respectively. N-type source and drain diffusion layers 45 and 46 are formed in a self-alignment manner by virtue of the second gate electrode 42, and the drain diffusion layer 46 is electrically connected to a wire 48 through a third contact hole 47.

Since in the above embodiment, the PROM memory cell has a structure in which the first gate electrode 36 is wrapped with the second gate electrode 42 as shown in FIG. 8, the ratio of the surface area of the second gate electrode 42 to that of the first gate electrode 36 is higher than in the conventional semiconductor device. As a result, the capacitance $C_{12}$ between the first and second gate electrodes 36 and 42 is larger than the capacitance $C_2$ between corresponding gate electrodes in the conventional case, and hence the writing voltage applied to the second gate electrode 42 is lower.

Further, modifying the above semiconductor device such that the capacitance $C_{12}$ between the first and second gate electrodes 36 and 42 is equal to the conventional capacitance $C_2$ enables the element to be made smaller than in the conventional case.

By virtue of the above structure, the capacitance between the first and second gate electrodes 36 and 42 can be increased without reducing the thickness of the second gate insulating film 43. This can prevent reduction of the breakdown voltage, and hence deterioration of the characteristics of the element.

Moreover, forming the first and second contact holes 39 and 40 in a self-alignment manner by virtue of the first gate electrode 36 contributes to scaling-down of the element.

The capacitance $C_{12}$ is substantially equal to around 1.7 times the capacitance $C_2$. How to obtain this value will be explained below.

Figure 1:
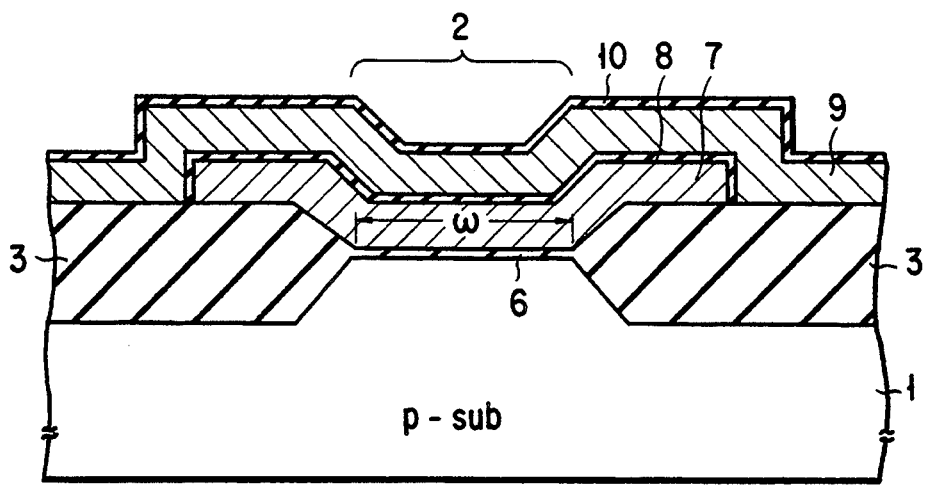
FIG. 1 is a cross sectional view, showing the memory cell structure of a conventional PROM.
Figure 2:
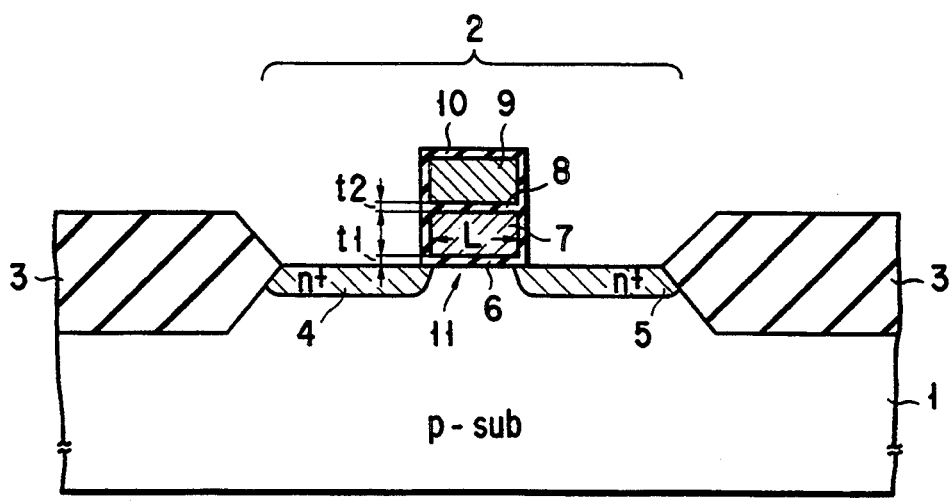
FIG. 2 is a cross sectional view of a two-layered gate electrode portion of the PROM memory cell, taken along the channel length direction thereof.
Figure 3:
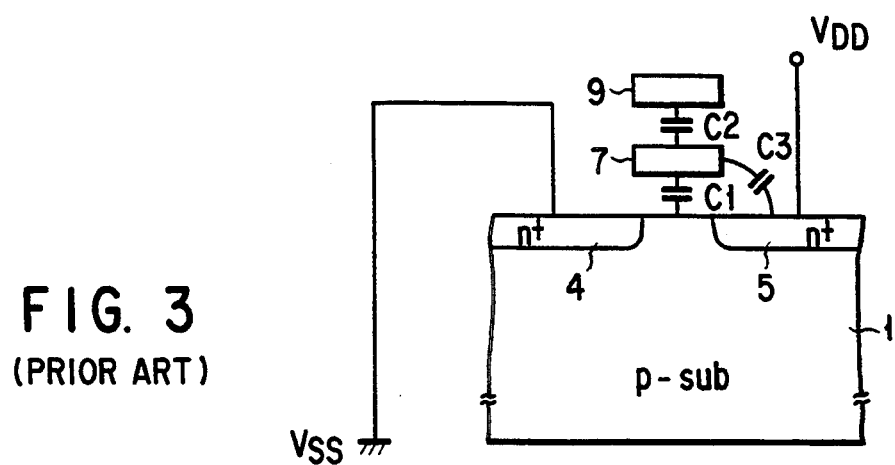
FIG. 3 is a diagram, showing an electrical circuit used at the time of writing in the conventional PROM memory cell.

As regards the conventional PROM shown in FIGS. 1-3, the following equations are established:

$$C_2/C_1 = (w+2w_1)\cdot L\cdot t_2^{-1}/w\cdot L\cdot t_1^{-1} \qquad (1)$$

when $$w=w_1, \quad C_2/C_1 = 3t_1/t \qquad (2)$$

where w represents the width of the portion of the first gate electrode 7 which is located on the element region 2, L the length of that portion of the electrode 7, $w_1$ the length of the portion of the first gate electrode 7 which is located on the field oxide film 3, $t_1$ the thickness of the first gate insulating film 6, $t_2$ the thickness of the second gate insulating film 8, $C_1$ the capacitance between the first gate electrode 7 and the p-type silicon substrate 1, and $C_2$ the capacitance between the first and second gate electrodes 7 and 9.

On the other hand, as regards the PROM of the invention shown in FIG. 8, the following equations are established:

$$C_{12}/C_1 = (w+2w_1+2w_1)\cdot L\cdot t_2^{-1}/w\cdot L\cdot t_1^{-1} \qquad (3)$$

when $$w=w_1, \quad C_{12}/C_1 = 5t_1/t_2 \qquad (4)$$

where w represents the width of the portion of the first gate electrode 36 which is located on the element region, L the length of that portion of the electrode 36, $w_1$ the length of the portion of the first gate electrode 36 which is located on the first side wall member 29 and the third oxide film 26, $t_1$ the thickness of the first gate insulating film 30, $t_2$ the thickness of the second gate insulating film 43, $C_1$ the capacitance between the first gate electrode 36 and the p-type silicon substrate 21, and $C_{12}$ the capacitance between the first and second gate electrodes 36 and 43.

From the equations (2) and (4), $C_{12}/C_2 = 1.67$

Although in the non-volatile semiconductor device in the embodiment, the capacitance between the first and second gate electrodes 36 and 42 is increased, a similar effect can be obtained in the DRAM cell shown in FIG. 10 wherein the first gate electrode 36 has the same potential as the p-type silicon substrate 21, i.e., the electrode 36 is connected to the substrate 21, in FIG. 10, elements similar to those in FIG. 8 are denoted by corresponding reference numerals, and explanation thereof is omitted.

In addition, although the channel-length directional length of the first polycrystal silicon film 23 shown in FIG. 7 is longer than that of the fourth polycrystal silicon film 41 shown in FIG. 8, they can be made equal to each other by etching the silicon film 23 in a self-alignment manner by virtue of the silicon film 41.

Although the element separating region 27 is formed by patterning the first oxide film 22, it can be formed by LOCOS (Local Oxidation of Silicon).

Although the first and second gate electrodes 30 and 43 are formed of polycrystal silicon, they can be formed of amorphous silicon or a silicide.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor memory device comprising:
   a semiconductor substrate;
   an element separating film formed on the semiconductor substrate and having separating film side surfaces;
   a conductive film formed on the element separating film and having conductive film side surfaces;
   a contact insulating film structure formed on the conductive film and having insulating film side surfaces;

first side wall members formed on the separating, conductive and insulating film side surfaces of the respective element separating film, conductive film, and contact insulating film structure;

a first gate insulating film structure formed on the semiconductor substrate, adjacent to the first side wall members;

a first gate electrode formed on the contact insulating film structure, on the first side wall members, and on the first gate insulating film structure and having electrode side surfaces;

a second gate insulating film structure formed on the first gate electrode and having second gate insulating film side surfaces;

second side wall members formed on the second gate insulating film side surfaces of the second gate insulating film structure and on the electrode side surfaces of the first gate electrode;

contact holes formed in the contact insulating film structure in a self alignment manner by virtue of the second side wall members, the contact holes having inner peripheral surfaces; and a second gate electrode formed on the inner peripheral surfaces of the contact holes, on the second side wall members, and on the second gate insulating film structure, the second gate electrode being connected to the conductive film.

2. The semiconductor memory device according to claim 1, wherein the conductive film is made of a material comprising one of polycrystal silicon, amorphous silicon, and a silicide.

3. The semiconductor memory device according to claim 1, wherein the first gate electrode is made of a material comprising one of polycrystal silicon, amorphous silicon, and a silicide.

4. The semiconductor memory device according to claim 1, wherein the second gate electrode is made of a material comprising one of polycrystal silicon, amorphous silicon, and a silicide.

5. A semiconductor memory device comprising:
a semiconductor substrate;
a first insulating film structure formed on the semiconductor substrate and having first side surfaces;
a first conductive layer formed on the first insulating film structure and having first conductive layer side surfaces;
a second insulating film structure formed on the first conductive layer and having second side surfaces;
first side wall members formed on the first and second side surfaces of the respective first and second insulating film structures, and on the first conductive layer side surfaces of the first conductive layer;
a second conductive layer formed on and connected to the semiconductor substrate, and having an end formed on the first side wall members and on the second insulating film structure, the second conductive layer having second conductive layer side surfaces;
a third insulating film structure formed on the second conductive layer and having third side surfaces;
second side wall members formed on the second conductive layer side surfaces of the second conductive layer and on the third side surfaces of the third insulating film structure;
contact holes formed in the second insulating film structure in a self alignment manner by virtue of the second side wall members, the contact holes having inner peripheral surfaces; and a third conductive layer formed on the inner peripheral surfaces of the contact holes, on the second side wall members, and on the third insulating film structure, the third conductive layer being connected to the first conductive layer.

6. A semiconductor memory device comprising:
a semiconductor substrate;
an element separating film formed on the semiconductor substrate;
a conductive film formed on the element separating film;
a contact insulating film structure formed on the conductive film, a first lamination comprising the element separating film, the conductive film and the contact insulating film structure having been patterned to form a first opening therethrough, the first opening exposing first side surfaces of the first lamination;
first side wall members formed on the first side surfaces;
a first gate insulating film structure formed on the semiconductor substrate, adjacent to the first side wall members;
a first gate electrode formed on the contact insulating film structure, on the first side wall members, and on the first gate insulating film structure;
a second gate insulating film structure formed on the first gate electrode, a second lamination comprising the second gate insulating film structure and the first gate electrode having been patterned to form a second opening therethrough, the second opening exposing second side surfaces of the second lamination;
second side wall members formed on the second side surfaces;
contact holes formed in the contact insulating film structure in a self alignment manner by virtue of the second side wall members, the contact holes exposing inner peripheral surfaces of the contact insulating film structure; and
a second gate electrode formed on the inner peripheral surfaces of the contact holes, on the second side wall members, and on the second gate insulating film structure, the second gate electrode being connected to the conductive film.

7. A semiconductor memory device comprising:
a semiconductor substrate;
a first insulating film structure formed on the semiconductor substrate;
a first conductive layer formed on the first insulating film structure;
a second insulating film structure formed on the first conductive layer, a first lamination comprising the first and second insulating film structures and the first conductive layer having been patterned to form a first opening therethrough, the first opening exposing first side surfaces of the first lamination;
first side wall members formed on the first side surfaces;
a second conductive layer formed on and connected to the semiconductor substrate, and having an end formed on the first side wall members and on the second insulating film structure;
a third insulating film structure formed on the second conductive layer, a second lamination comprising the third insulating film structure and the second conductive layer having been patterned to form a second opening therethrough, the second opening exposing second side surfaces of the second lamination;

second side wall members formed on the second side surfaces;

contact holes formed in the second insulating film structure in a self alignment manner by virtue of the second side wall members, the contact holes exposing inner peripheral surfaces of the contact holes; and a third conductive layer formed on the inner peripheral surfaces of the contact holes, on the second side wall members, and on the third insulating film structure, the third conductive layer being connected to the first conductive layer.

8. A semiconductor memory device defining an MOS transistor channel length extending in a first direction between a source and a drain, the device comprising:

a semiconductor substrate;

an element separating film formed on the semiconductor substrate and having separating film side surfaces;

a conductive film formed on the element separating film and having conductive film side surfaces;

a contact insulating film structure formed on the conductive film and having insulating film side surfaces;

first side wall members formed on the separating, conductive and insulating film side surfaces of the respective element separating film, conductive film, and contact insulating film structure;

a first gate insulating film structure formed on the semiconductor substrate, adjacent to the first side wall members;

a first gate electrode formed on the insulating film structure, on the first side wall members, and on the first gate insulating film structure and having electrode side surfaces;

a second gate insulating film structure formed on the first gate electrode and having second gate insulating film side surfaces;

second side wall members formed on the second gate insulating film side surfaces of the second gate insulating film structure and on the electrode side surfaces of the first gate electrode;

contact holes formed in the contact insulating film structure in a self alignment manner by virtue of the second side wall members, the contact holes having inner peripheral surfaces; and a second gate electrode formed on the inner peripheral surfaces of the contact holes, on the second side wall members, and on the second gate insulating film structure, the second gate electrode being connected to the conductive film, a width of the second gate electrode extending in the first direction being substantially equal to the MOS transistor channel length.

* * * * *